(12) United States Patent
Wang et al.

(10) Patent No.: US 8,194,159 B2
(45) Date of Patent: Jun. 5, 2012

(54) SYSTEM AND METHOD FOR LENS SHADING CORRECTION OF AN IMAGE SENSOR USING SPLINES

(75) Inventors: XiaoYong Wang, Sunnyvale, CA (US); Jizhang Shan, Cupertino, CA (US); Donghui Wu, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 1021 days.

(21) Appl. No.: 12/110,618

(22) Filed: Apr. 28, 2008

(65) Prior Publication Data

US 2009/0268053 A1    Oct. 29, 2009

(51) Int. Cl.
*H04N 9/64* (2006.01)
*H04N 5/20* (2006.01)

(52) U.S. Cl. .......................... 348/251; 348/255
(58) Field of Classification Search .......... 348/187–188, 348/241, 251–252, 335, 229.1, 41, 246, 247, 348/248, 250, 255, 294
See application file for complete search history.

(56) References Cited

U.S. PATENT DOCUMENTS

| | | | | |
|---|---|---|---|---|
| 7,609,302 B2 * | 10/2009 | Jerdev et al. | .............. | 348/241 |
| 7,751,619 B2 * | 7/2010 | Kawanishi et al. | .............. | 382/167 |
| 2002/0025164 A1 * | 2/2002 | Suzuki | .............. | 396/429 |
| 2006/0033005 A1 * | 2/2006 | Jerdev et al. | .............. | 250/208.1 |
| 2008/0074515 A1 * | 3/2008 | Takane | .............. | 348/251 |

OTHER PUBLICATIONS

Wang, Yue et al, "Lane Detection Using B-Snake," *School of Electrical and Electronic Engineering, Nanyang Technological University*, 1999 IEEE, pp. 438-443.

* cited by examiner

*Primary Examiner* — David Ometz
*Assistant Examiner* — Ahmed A Berhan
(74) *Attorney, Agent, or Firm* — Lathrop & Gage LLP

(57) ABSTRACT

An image sensing system provides for accurate lens shading correction even when there is significant lens shading asymmetry and non-uniformity. A two-dimensional B-spline technique is used to determine lens shading correction surfaces. The number of zones is selected to achieve accurate correction of center, edge, and corner regions of an image. Separate lens shading correction surfaces are calculated for a set of standard illuminants to permit lens shading correction to be adapted based on the illuminant used to capture the image.

7 Claims, 7 Drawing Sheets

Conventional Symmetric Method
Corrected Luminance Surface Results

| | | | | | | | |
|---|---|---|---|---|---|---|---|
| 119 | 104 | 108 | 111 | 112 | 113 | 109 | 120 |
| 121 | 110 | 111 | 112 | 112 | 113 | 110 | 116 |
| 140 | 135 | 133 | 132 | 131 | 131 | 127 | 129 |
| 161 | 163 | 163 | 157 | 156 | 153 | 148 | 144 |
| 172 | 174 | 172 | 167 | 168 | 161 | 154 | 152 |
| 172 | 167 | 162 | 156 | 154 | 153 | 151 | 155 |
| 162 | 144 | 135 | 130 | 128 | 131 | 136 | 153 |
| 152 | 118 | 107 | 104 | 103 | 110 | 120 | 150 |

FIG. 5A

Spline Method Corrected Luminance
Surface Results

| | | | | | | | |
|---|---|---|---|---|---|---|---|
| 171 | 172 | 174 | 173 | 174 | 174 | 173 | 172 |
| 171 | 173 | 173 | 174 | 174 | 173 | 174 | 172 |
| 174 | 175 | 175 | 176 | 176 | 175 | 175 | 174 |
| 174 | 175 | 175 | 176 | 176 | 174 | 175 | 173 |
| 174 | 176 | 176 | 177 | 177 | 176 | 176 | 174 |
| 174 | 175 | 175 | 176 | 176 | 175 | 175 | 174 |
| 173 | 174 | 175 | 176 | 176 | 175 | 175 | 174 |
| 173 | 173 | 174 | 174 | 174 | 174 | 174 | 174 |

FIG. 5B

SYSTEM AND METHOD FOR LENS SHADING CORRECTION OF AN IMAGE SENSOR USING SPLINES

FIELD OF THE INVENTION

The present invention is generally related to techniques to correct for lens shading in image sensors. More particularly, the present invention is directed to using two-dimensional B-spline curve fitting to perform a lens shading correction.

BACKGROUND OF THE INVENTION

One issue that arises in the operation of image sensors is the need to perform lens shading correction. An image sensor typically has a two-dimensional array of photo-sensitive pixels. An optical assembly may include a lens and a micro-lens array to focus light onto individual pixels. However, various imperfections in the optical assembly create a shading effect. One common shading effect is that that the image is brighter in the center and decreases in brightness at the edges of the pixel array. More generally there will be a two-dimensional variation in shading across the array of pixels caused by the optical elements in the optical assembly and the difficulties in uniformly projecting an image across the field of view of the image sensor. Additionally, in the most general case shading effects may be asymmetric. For example, one edge may be shaded more than another if there is imperfect optical alignment and/or optical imperfections in optical components.

Uncorrected shading effects can result in undesirable variations in intensity across an image that may be discernable to an end user. Lens shading correction algorithms are used to correct for shading in an image sensor. Empirical data is used to determine coefficients of a gain correction function that is used to adjust the gain of individual pixels to compensate for the lens shading. Two common conventional solutions to correct lens shading in image sensor chips include the symmetric method and the two direction multiplication method. Both of these conventional solutions have significant drawbacks.

The symmetric method presumes that lens shading is circularly symmetric. That is, the symmetric method presumes that shading depends only on a radial distance from an optical center point in the image sensor. Consequently, the symmetric method utilizes one quadratic polynomial in r, the radius, to compensate for the shading. The correction equation for the symmetric method is $G=a*r*r+b*r+1$, $r=(x*x+y*y)^0.5$, where r is the radius, a and b are correction factors, and the radius depends on x and y in accordance with a conventional conversion between Cartesian and circular coordinate systems. However, note that the symmetric method presumes that there is nearly perfect radial optical alignment of all optical components and that the optical components possess a nearly perfect radial symmetry. However, these fundamental assumptions underlying the symmetric method are not valid for many types of packaged image sensors unless special attention is taken in the design of the optical components. Studies by the inventors indicate that the symmetric method often generates poor correction results for a variety of packaged image sensors.

The two-direction multiplication method assumes that lens shading can be compensated by a 2-dimensional correction function $F(x,y)$, having a profile in both the x and y directions that is a quadratic polynomial with coefficients independently programmable in each direction. The correction equation for the two direction multiplication method is $G=F(x,y)=h(x)*v(y)$ where $h(x)$ and $v(y)$ are each piecewise quadratic polynomials and $F(x,y)$ is the product of the two quadratic polynomials $h(x)$ and $v(y)$. However, a drawback of this approach is that it is difficult to accurately correct the entire image. In particular, investigations by the inventors indicate that a single quadratic polynomial that properly corrects the center of the image will often not adequately correct the corner regions of the image sensor.

Therefore in light of the above-described problems a new apparatus, system and method for lens shading image correction in image sensors is desired.

SUMMARY OF THE INVENTION

An image sensing system includes a lens shading correction module to provide lens shading correction. The lens shading correction module corrects the gain of individual pixels in a captured image to correct for optical shading effects. In one embodiment the lens shading correction module adapts to different lighting conditions by storing shading corrections for a set of at least two standard illuminants and adjusting the lens shading correction for the captured image based on which illuminant is detected for the captured image.

In one embodiment the lens shading correction module utilizes a multi-zone technique to support accurate lens shading correction when there is significant lens shading asymmetry and non-uniformity. In this embodiment the lens shading correction module stores a two-dimensional correction surface in which the image sensor is partitioned into at least three sections in an x-dimension and at least three sections in a y-dimension to form at least nine different rectangular-shaped zones. Each zone has a first piecewise continuous quadratic polynomial correction curve in an x-dimension and a second piecewise continuous quadratic polynomial correction curve in a y-dimension. The number of zones is selected to achieve accurate shading correction of both a center portion of the image and edge portions of the image.

In one embodiment the lens shading correction module utilizes a multi-zone technique to support accurate lens shading correction based on two-dimensional B-spline curve fitting. In this embodiment the lens shading correction module stores a two-dimensional shading correction surface based on a two-dimensional B-spline curve-fitting of calibration data.

BRIEF DESCRIPTION OF THE FIGURES

The invention is more fully appreciated in connection with the following detailed description taken in conjunction with the accompanying drawings, in which:

FIG. 5A is a luminance surface illustrating lens shading correction uniformity using a prior art correction method; and FIG. 5B is a luminance surface illustrating lens shading correction uniformity in accordance with one embodiment of the present invention.

Like reference numerals refer to corresponding parts throughout the several views of the drawings.

DETAILED DESCRIPTION OF THE INVENTION

Figure 1:
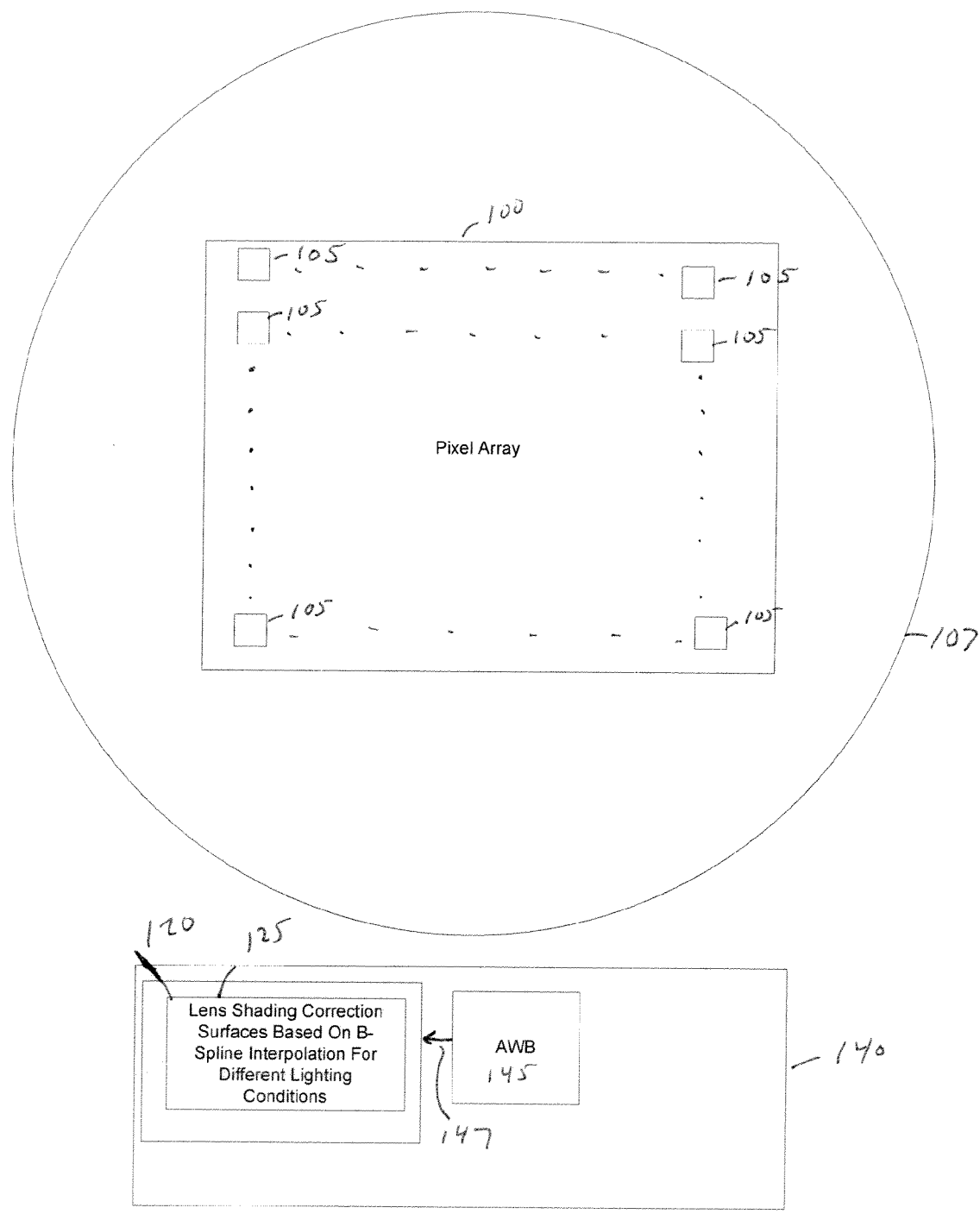
FIG. 1 is a block diagram of an image sensing system with lens shading correction in accordance with one embodiment of the present invention.

FIG. 1 is a block diagram illustrating an image sensing system having an image sensor 100 with an array of photo-sensitive pixels 105. The photo-sensitive pixels are arranged in rows (in an x-dimension) and columns (in a y-dimension). As an illustrative example image sensor 100 may be implemented as a complementary metal oxide semiconductor (CMOS) image sensor. An image processor 140 receives captured images from image sensor 100 and processes the captured images.

In a packaged optical module, light is focused onto each pixel 105 of image sensor 100 via optical components such as a lens 107 (illustrated as a circle for illustrative purposes). However, more generally a packaged optical module may also include other optical components known in the art, such as a color filter array (CFA) micro-lens array to direct light to each pixel and also define different pixel colors. The combined optical response of all optical components in the packaged optical module results in a lens shading effect in which the image is typically brighter in the center and dimmer about the edges. Note that every lens has some degree of shading. In a commercial manufacturing process it is desirable to have the flexibility to choose different optical components based on various factors such as cost, size, and availability. It is also desirable in a commercial manufacturing process to not require precise optical alignment of all components or an identical shading response for each color of light. Various imperfections in the optical response of individual optical components and the optical alignment of components can result in lens shading. Additionally, lens shading may be affected by the size of an image sensor. All else being equal (in terms of optical components) an image sensor having a larger area may experience more severe shading effects due to the difficulties in preventing shading over a large image sensor area.

A lens shading correction module 120 is provided to correct the gain of individual pixels 105. The lens shading correction module 120 may, for example, be implemented as software or firmware. The lens shading correction module 120 may be implemented in image processor 140 as software designed to implement lens shading correction. Alternatively, lens shading correction module 120 may be implemented in image sensor 100. The lens shading correction module 120 utilizes lens shading correction surfaces 125 to determine gain correction for individual pixels to account for lens shading. An individual correction surface may, for example, comprise parameters to calculate gain correction although it will also be understood that in some cases a correction table may be stored.

In one implementation the set of correction surfaces is based on calibration data taken for different standard illuminants such as daylight, cold white fluorescent (CWF), and the "A" illuminant. An automatic white balance (AWB) module 145 is used to estimate the illuminant used to capture the image and provides an illuminant indication signal 147 to the lens shading correction module 120 to select a correction surface appropriate for the illuminant. Different illuminants have different optical wavelength responses and hence may have somewhat different shading. The Auto-White-Balance (AWB) module 145 determines the type of illuminant used to capture the image and generates an illuminant indicator signal 147 that instructs lens shading correction module 120 of the type of illuminant used to capture the image.

Figure 2A:
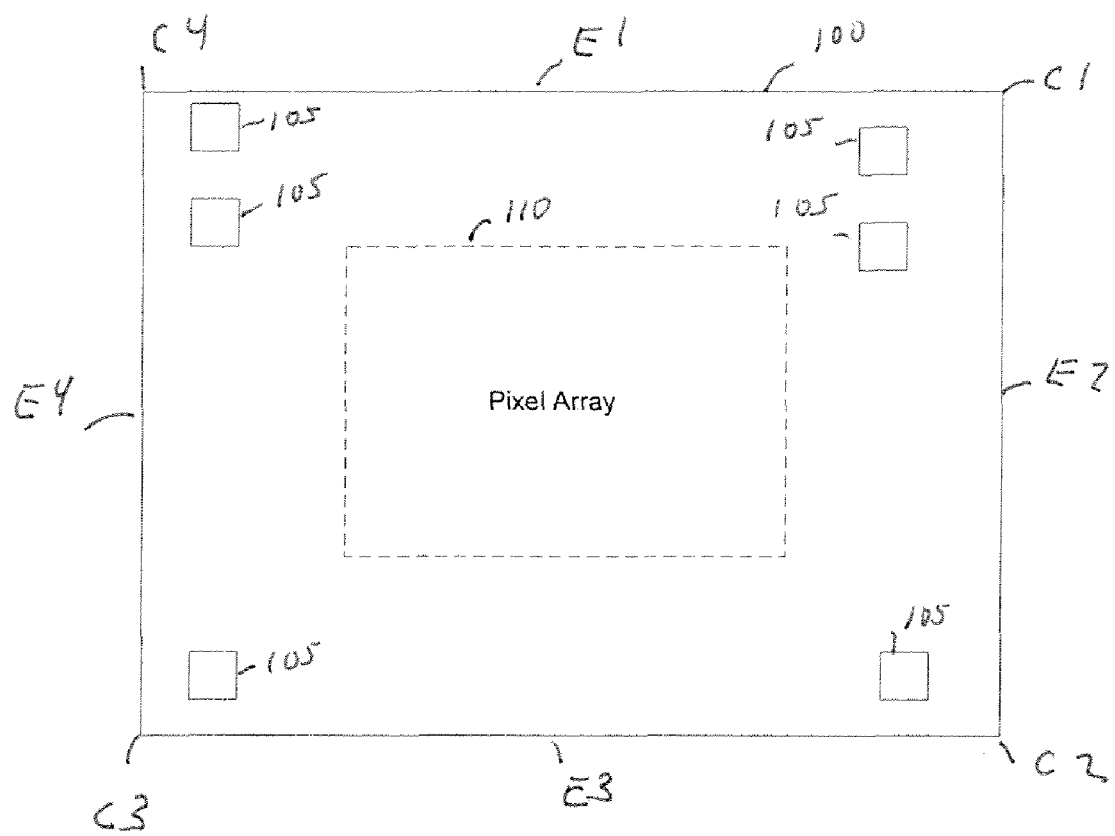
FIGS. 2A-2C illustrate some of the benefits associated with a multi-zone lens shading correction technique in accordance with one embodiment of the present invention.
Figure 2B:
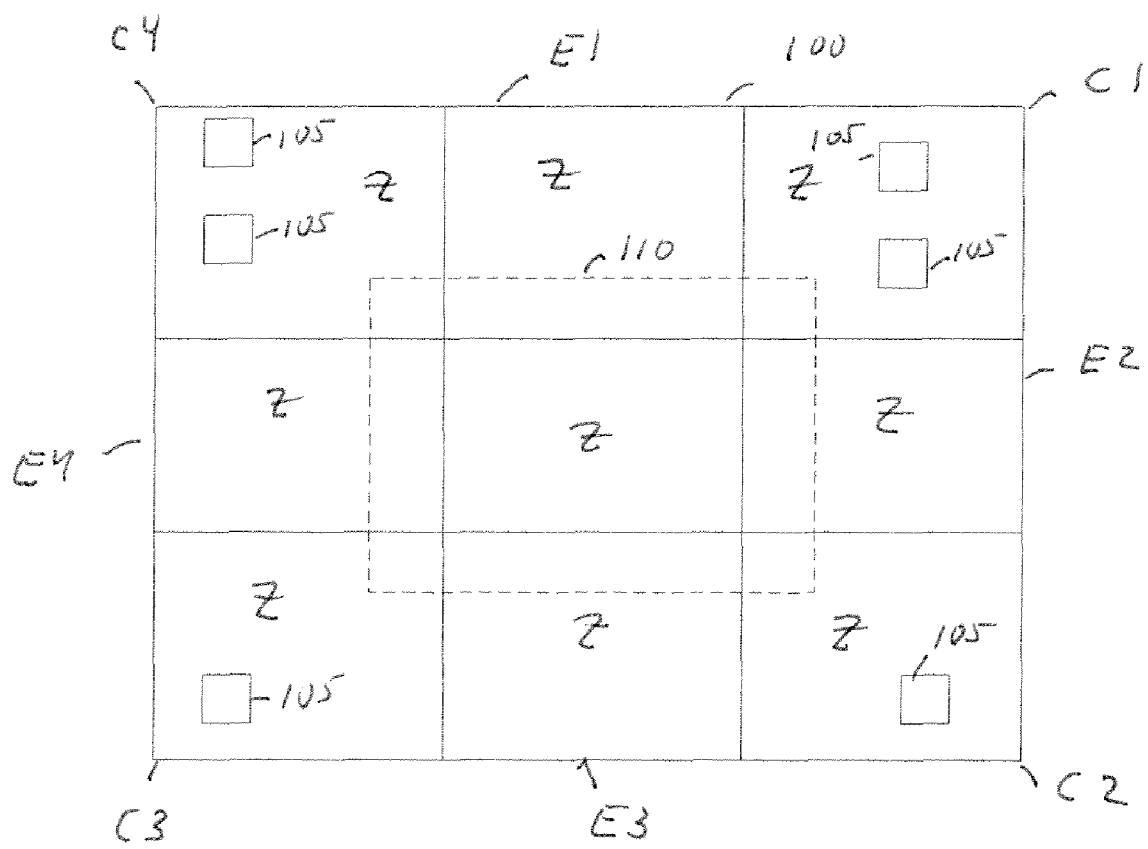

In one implementation the correction surfaces are calculated using a multi-zone technique. Referring to FIG. 2A, image sensor 100 has a center portion 110, indicated by dashed lines, and four edges (E1, E2, E3, and E4) and four corner regions (C1, C2, C3, and C4). Conventional lens shading correction techniques have problems simultaneously correcting a center portion 110, edges, and corner regions, particularly for the case of a highly asymmetric and non-uniform shading response. Referring to FIG. 2B, in one embodiment the image sensor is divided into a plurality of zones (Z). By selecting at least three zones in each dimension there will be at least one zone overlapping the center portion 110 along with at least one zone overlapping each edge and corner. In the most general case the shading may be asymmetric and/or non-uniform in edge and corner regions. By selecting at least three zones in each dimension the center portion 110 can be accurately corrected along with the edges and corners, even if there is a high degree of shading asymmetry and variation in shading in edge portions and corners.

Figure 2C:
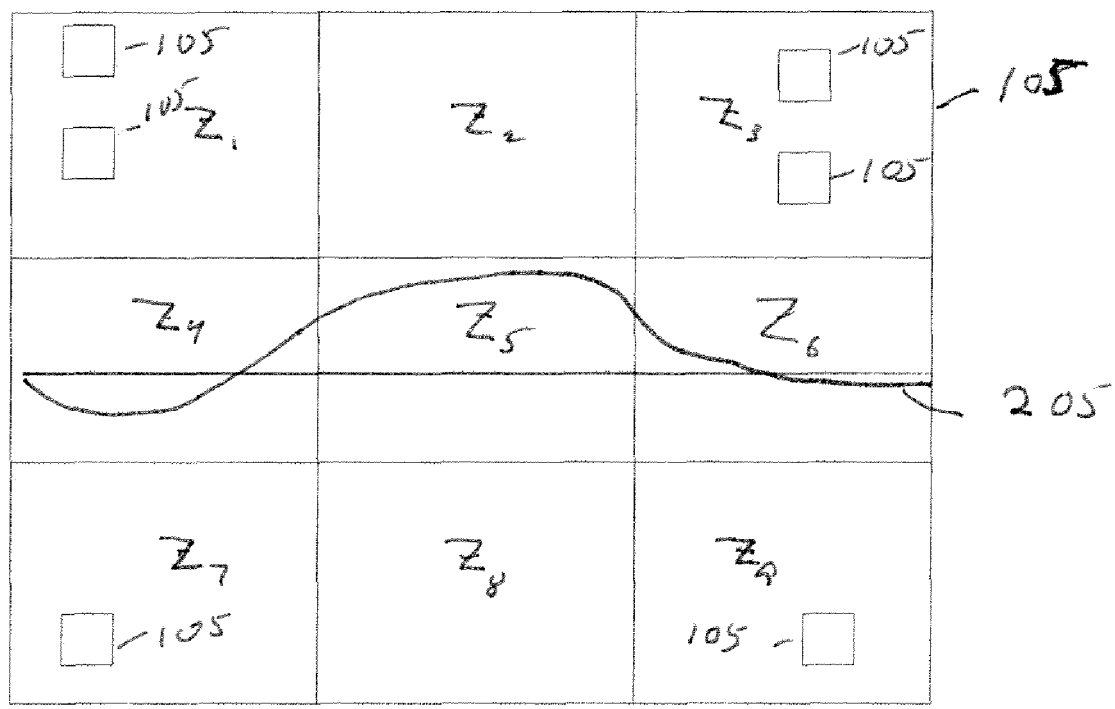

Referring to FIG. 2C, in one embodiment the image sensor 105 is divided into a plurality of zones (for the purposes of illustration nine zones Z1 . . . Z9 are illustrated). The correction surface in each zone is determined from calibration data using a curve-fitting interpolation algorithm. The use of a plurality of zones permits the lens shading correction to optimize both the lens shading correction of both the center and edges of the pixel array, Moreover, the use of a plurality of zones permits the lens shading correction to handle significant degree of asymmetry. Referring to illustrative shading curve 205, the lens shading along a particular line of pixels may be fitted using separate piecewise continuous curve segments in which each zone has its own curve segment function (e.g., a quadratic equation). The accuracy of the correction surface is thus improved over conventional techniques that perform curve fitting over a single zone covering the entire image sensor. In the example of curve 205, the correction to a center portion (zone Z5) can be optimized along with edge portions (zones Z4 and Z6). Moreover, asymmetry in the shading of edge portions (zones Z4 and Z6) can be corrected.

In one embodiment the lens shading correction module 120 utilizes a correction surface 125 based on B-spline (basis-spline) curve interpolation of lens shading calibration data. B-splines are piecewise polynomial functions used to approximate curves. B-splines have a set of control points. The control points determine the number of different polynomial curve segments used to approximate a curve. If there are n control points there are n−2 connected curve segments, or n−2 zones in a particular linear dimension. For example quadratic B-spline curve fitting (in one dimension) with five control points corresponds to three piecewise continuous quadratic curve segments (i.e., three zones in one dimension, with each curve segment being a separate quadratic function).

Figure 3:
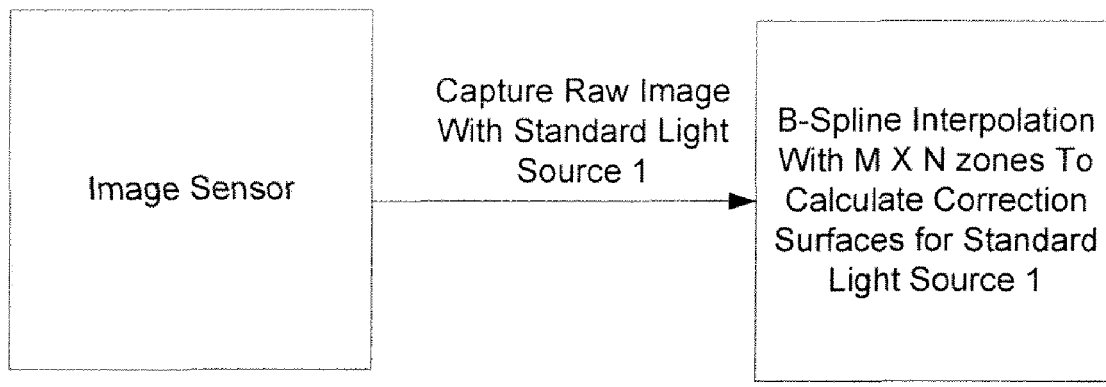
FIG. 3 illustrates lens shading correction calibration with different illuminants in accordance with one embodiment of the present invention.
Figure 3:
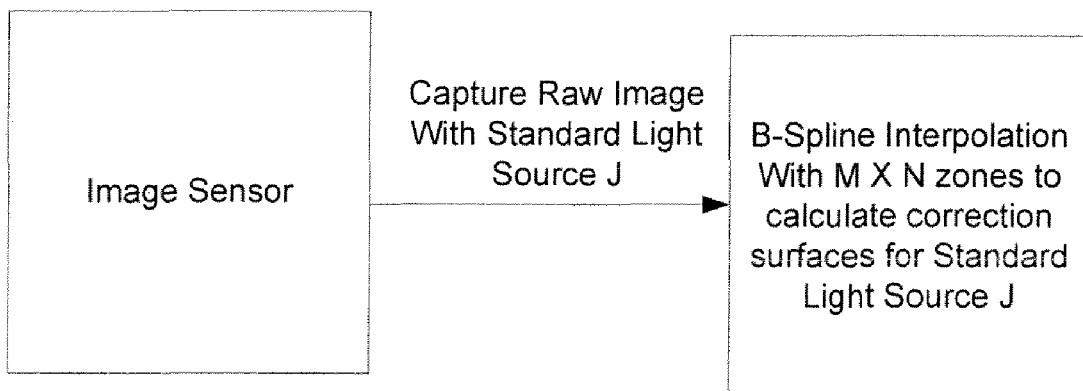

FIG. 3 illustrates a calibration technique for different illuminants. For each standard illuminant a set of calibration data is collected. The set of calibration data for each illuminant may correspond to a pre-selected number of images (to account for noise in an individual image sensor) and also may include average over a number of different sensors (to account for statistical variations between nominally identical image sensors). The calibration process is repeated for different standard illuminants, with the illuminants preferably spanning a region in color space corresponding to a range of illuminants from which correction data may be interpolated for an arbitrary illuminant likely to be encountered during normal use of the image sensor.

Figure 4:
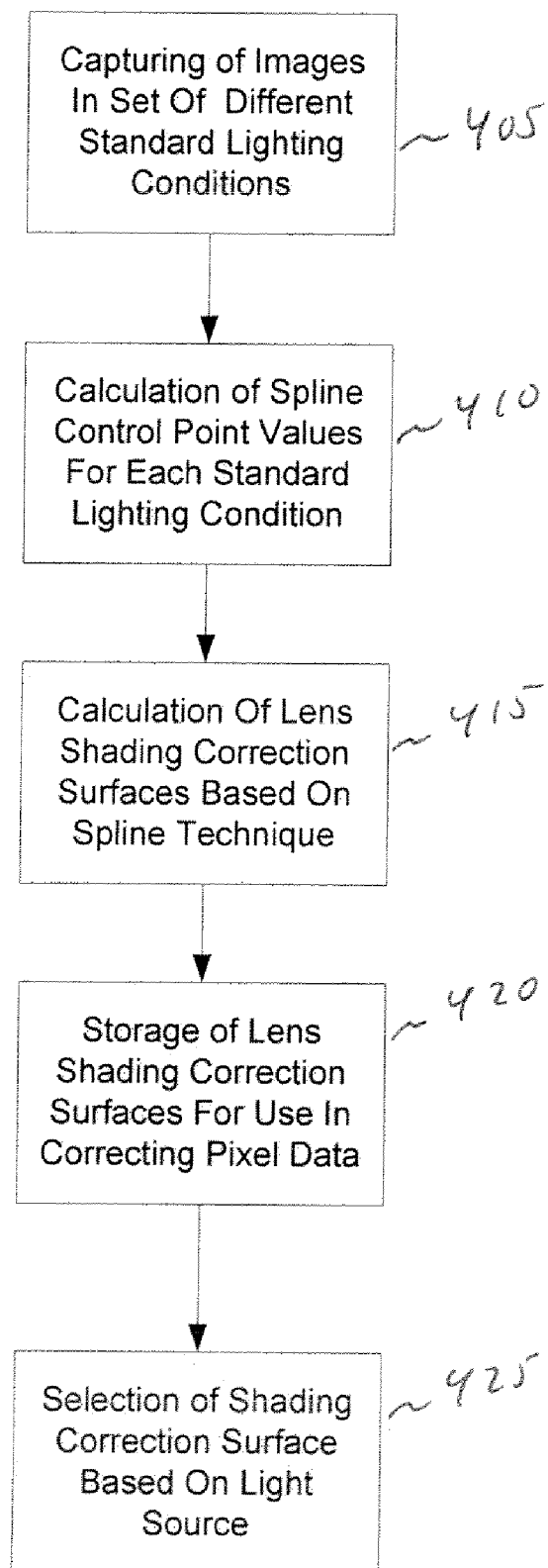
FIG. 4 is a flow chart illustrating a method of performing shading correction in accordance with one embodiment of the present invention.

FIG. 4 is a flow chart of an illustrative method in accordance with one embodiment of the present invention. In step

405 a set of images is captured in different illuminant lighting conditions as calibration data. If desired, the set of images may include a pre-selected number of images for each illuminant to provide a statistical average. In step 410, two-dimensional quadratic B-spline control point values are calculated from the calibration data for each illuminant. In step 415, lens shading correction surfaces are calculated based on the control point values. As will be described in more detail, a primary correction surface may be selected along with differential correction surfaces. In step 420, the lens shading correction surfaces are then stored for use in correcting captured images (e.g., provided to an image processor). In step 425, in the subsequent use of an image sensor, a shading correction surface is selected based on a determination of the illuminant used to capture the image.

FIG. 5A illustrates a two-dimensional luminance surface (in 8×8 regions) for an image sensor after lens shading correction using a conventional symmetric lens shading correction method. FIG. 5B illustrates a two-dimensional luminance surface using a two-dimensional quadratic B-spline surface with 8×8 zones. Perfect lens shading correction would result in identical luminance values in each region. FIG. 5A illustrates the result of using the symmetric method based on modeling the shading correction function as single radial quadratic in r, the radius. It can be seen in FIG. 5A that the luminance varies from a value of 103 to a value of 174, which is a large percentage variation. It can also be seen in FIG. 5A that there is significant non-uniformity and asymmetry of the luminance values. The lens shading correction results of FIG. 5A would, in many cases, be unacceptable for end-users (due to variations in gray scales). In contrast, the luminance values in FIG. 5B vary from 171 to 177, which is a comparatively tight range.

This empirical data of FIGS. 5A and 5B demonstrate that the lens shading correction technique of the present invention provides improved lens shading correction, particularly when there is significant optical asymmetry and non-uniformity in the lens shading. The benefit to the end-user of a camera that includes the image sensor is improved image quality. The image sensor designer also has the advantage that there is greater freedom to select the optical components used in a packaged image sensor because even a large degree of lens shading asymmetry and non-uniformity can be accurately corrected using a practical amount of storage and computing resources. Thus, in some cases the image sensor designer can make selections of optical components that would not be practical if conventional shading correction techniques (such as the symmetric method) were used.

Moreover, the number of control points can be increased, if necessary, to improve the accuracy of the lens shading correction and/or to handle larger variations in shading uniformity and asymmetry. In one implementation one or more shading correction criterion are defined. Examples of shading correction criteria including statistical attributes of the variation in the corrected image. For a particular set of optical components, the calibration data is taken using any of the above-described techniques. The number of control points is selected to be a minimum number that satisfies the shading correction criteria and correction surfaces are then calculated.

Additional details of an exemplary B-spline curve fitting algorithm to perform lens shading correction will now be described in more detail. In one embodiment the method is based on a two-dimensional B-spline fitting algorithm. In this method, each pixel gain is represented as the product of two conic curves. A benefit of the B-spline method is that it can correct lens shading nearly perfectly by adjusting the number of control points and increasing them (if necessary) to achieve the desired lens shading correction accuracy. An exemplary number of control points is five in each dimension, however additional control points may be utilized if necessary to achieve the desired lens shading correction accuracy.

First, a one dimensional curve fitting of calibration data (to calculate correction parameters) is applied using the spline technique. Suppose there are X points in a pixel line of pixel calibration data. This one-dimensional data can be fitted using N control points (control parameters) using the spline method, where N is more than or equal to 3. The curve fitting precision is higher when N is increased. However, a captured image has a sequence of pixel lines corresponding to a two-dimensional surface. It can be shown that only M*N control points are required for two-dimensional B-spline curve fitting of calibration data of a captured image. Suppose there are Y columns of pixels and X points in each row of an image. The total number of points are thus initially X*Y. First each row is fitted with N control points using the one dimension spline method. This results in N*Y control points for total image. Then each column of N*Y is fitted with M control points using one dimension spline method. This results in only M*N control points required to describe the captured (calibration) image in two dimensions. A two-dimensional surface may then be calculated (based on the M*N control points calculated from the raw calibration data) to generate correction parameters for an output image using interpolation of a two-dimensional surface using the spline method.

Spline matrix equations may be used to calculate control parameters from raw calibration data and generate correction surfaces using quadratic B-spline techniques. Suppose there are M*N calibration (control point) parameters (M for horizontal and N for vertical). For each horizontal (pixel row) line, it is necessary to calculate M horizontal control parameters from M*N calibration parameters. For each pixel, then we calculate one gain value from the M control parameters. The correction calculation equations are the same for both horizontal and vertical directions:

$$H = [\, h_1, \quad h_2, \quad h_3 \,]^T$$

$$K = [\, k_1, \quad k_2, \quad k_3 \,]^T$$

$$M_1 = \begin{bmatrix} m_{11} & m_{12} & m_{13} \\ m_{21} & m_{22} & m_{23} \\ m_{31} & m_{32} & m_{33} \end{bmatrix} \quad (3*3 \text{ matrix})$$

$$K = M_1 * H$$

$$g = k_1 * x^2 + k_2 * x + k_3$$

where H is control point parameter vector and K is conic coefficient vector while $M_1$ is a 3*3 transition matrix and g is the gain value. These equations are then used to define parameter values that are stored to define a particular correction surface.

For image sensors designed to capture color images the lens shading will have not only luminance shading but color (chroma) shading. That is, there will be a wavelength dependence of the shading with each color light having somewhat different shading. However, the different color channels have a strong correlation each other. Thus, if a correction surface is calculated for one principal color channel ($C_1$) using a first number of control points, correction surfaces for the other color channels can be calculated as surfaces normalized to $C_1$, i.e., $Cn/C_1$. When it is time to perform shading correction the $C_1$ correction surface is first determined and then the Cn correction surface can be determined by multiplying $C_1$ and Cn/C1 (i.e., $C_1*Cn/C_1$). The normalized correction surfaces may be calculated using a smaller number of control points. Consider the example of a red-green-blue (RGB) image sensor in which the red (R), green (G) and blue (B) pixels will experience somewhat different shading and require different correction. If the three color channels (RGB) are treated separately, the computation, storage, and calibration cost is larger than desired. To get the same correction effect, the necessary number of control points in B/G and R/G channels are far less than those of B and R channels. In one embodiment G, B/G and R/G channel are chosen as correction targets. The G channel is calibrated with the greatest number of control points. The other normalized channels (B/G and R/G) are then calibrated with a reduced number of control points to reduce computational and storage requirements. That is the correction targets in this example are as follows:

Gain=g: for the G channel

Gain=g*(B/G) for the B channel

Gain=g*(R/G) for the R channel

While RGB is an exemplary color space, it will be understood that this technique may be applied to other color spaces as well.

Empirical studies were performed comparing individual calibration of B, G, R color channels using 8*8 control points with calibrating the g color channel using 8*8 control points and using 6*6 control points for the g/b and g/r channels. The results were nearly the same. Thus, a significant reduction in computational resource and storage requirements is achieved compared to performing separate analysis of each channel.

As previously described, the lens shading changes with environmental light source (e.g., illuminant, such as DAY illuminant, Cold White Light (CWL) illuminant, or other common light sources). Each illuminant has a different spectral response such that the shading may vary with the color temperature value of the illuminant. This is because, as previously described, the optical components of a packaged image sensor will have a wavelength response over the pixel array. Empirical studies by the inventor of a packaged image sensor demonstrate that accurate shading correction requires the use of different lens shading correction surfaces. For example, lens shading in a DAY illuminant and an A illuminant are empirically quite different. The solution for this problem is to set a main correction surface and preferably at least two additional correction surfaces to permit linear interpolation to be used to calculate a correction surface for an arbitrary illuminant. The addition correctional surfaces may be implemented as differential correction surfaces having only several values to save cost. The main (primary) correction surface is preferably a high color temperature condition (e.g., daylight). Additional correction surfaces (for an arbitrary illuminant) may be interpolated linearly using values for the two additional surfaces for other conditions. This permits, for example, a correction surface to be calculated when the color temperature changes towards low. In one implementation, the correction surface for an arbitrary illuminant is calculated from a base surface ($H_{base}$). A differential correction function is the product of a factor ($H_{delta}$) and a linear interpolation function (f (p), where p depends linearly on AWB gains). The correction surface, H, can then be calculated using the following equations:

$H=H_{base}+H_{delta}*f(p)$, where $p=B_{gain}/R_{gain}$ and where $B_{gain}$ and $R_{gain}$ are AWB gains.

An exemplary calibration procedure is to capture three raw images in standard DAY, CWL and A light for each sensor. The three raw images are averaged to eliminate sensor variation. Three lens shading correction surfaces are then calculated for each respective illuminant. The correction surface for the DAY illuminant is chosen as the main correction surface and two additional correction surfaces are chosen based on the surface difference between CWL, A and DAY.

It will be understood from the previous discussion that the correction surfaces may be stored on a computer readable medium for use with a processor to implement lens shading correction. Additionally, as previously described the lens shading correction may be implemented in software. Consequently it will be understood that an embodiment of the present invention relates to a computer storage product with a computer-readable medium having computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, Floppy disks, and magnetic tape; optical media such as CD-ROMs, DVDs and holographic devices; magneto-optical media; and hardware devices that are specially configured to store and execute program code, such as application-specific integrated circuits ("ASICs"), programmable logic devices ("PLDs") and ROM and RAM devices. Examples of computer code include machine code, such as produced by a compiler, and files containing higher-level code that are executed by a computer using an interpreter. For example, an embodiment of the invention may be implemented using Java, C++, or other object oriented programming language and development tools. Another embodiment of the invention may be implemented in hardwired circuitry in place of, or in combination with, machine executable software instructions.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications they thereby enable others skilled in the art to best utilize the invention and various embodiments with various modifications as are suited to the particular use contemplated. It is intended that the following claims and their equivalents define the scope of the invention.

The invention claimed is:

1. An image sensing system, comprising:
a lens shading correction module to correct a gain of each pixel of a captured image for optical shading effects, the lens shading correction module storing a two-dimensional correction surface in which an image sensor is partitioned into at least three sections in an x-dimension and at least three sections in a y-dimension to form at least nine different rectangular-shaped zones with each zone having a first piecewise continuous quadratic polynomial correction curve in an x-dimension and a second piecewise continuous quadratic polynomial correction curve in a y-dimension, the number of zones being selected to achieve accurate shading correction of both a center portion of the image and edge portions of the image;

wherein there is a correlation in shading response between different color channels, the two-dimensional correction surface corresponding to a single color channel ($C_1$) having a first number of associated control points and wherein each additional color channel ($C_n$) has a correction surface represented as a correction surface normalized by the response of the single color channel ($C_n/C_1$) and having a second number of associated control points less than said first number.

2. The image sensing system of claim 1, wherein the two-dimensional correction surface corresponds to a two-dimensional quadratic B-spline having at least five control points in an x-dimension and five control points in a y-dimension to form at least three zones in each of the x and y dimensions.

3. The image sensing system of claim 1, wherein the lens shading correction module stores shading correction surfaces for a set of at least two standard illuminants with the lens shading correction module adjusting the lens shading correction for the captured image based on a detected illuminant of the captured image.

4. The image sensing system of claim 3, wherein the detected illuminant is identified by an auto white balance module.

5. The image sensing system of claim 3, wherein the shading correction surfaces includes a main correction surface to perform shading correction for one standard illuminant and differential values to interpolate at least one other correction surface for other illuminants.

6. The image sensing system of claim 1, wherein the two-dimensional correction surface corresponds to a two-dimensional quadratic B-spline having at least five control points in the x-dimension and five control points in the y-dimension.

7. The image sensing system of claim 1, wherein said lens shading correction module is disposed in an image processor receiving pixel data from an image sensor.

* * * * *